(12) United States Patent
Wu (10) Patent No.: US 7,989,578 B2
(45) Date of Patent: Aug. 2, 2011

(54) NEGATIVE PHOTOSENSITIVE POLYIMIDE POLYMER AND USES THEREOF

(75) Inventor: Chung-Jen Wu, Tainan (TW)

(73) Assignee: Eternal Chemical Co., Ltd. (TW)

( * ) Notice: Subject to any disclaimer, the term of this patent is extended or adjusted under 35 U.S.C. 154(b) by 638 days.

(21) Appl. No.: 11/980,103

(22) Filed: Oct. 30, 2007

(65) Prior Publication Data

US 2008/0103275 A1    May 1, 2008

(30) Foreign Application Priority Data

Oct. 30, 2006   (TW) .............................. 95140055 A (51) Int. Cl.
*C08G 73/10*      (2006.01)

(52) U.S. Cl. ........ 528/310; 528/170; 528/172; 528/173; 528/174; 528/188; 528/189; 430/283.1; 430/325; 525/420

(58) Field of Classification Search .................. 528/310, 528/170, 172–174, 188, 189; 430/283.1, 430/325, 326; 525/420
See application file for complete search history.

(56) References Cited

U.S. PATENT DOCUMENTS

6,010,825 A * 1/2000 Hagen et al. ............... 430/283.1
6,610,815 B1 * 8/2003 Hata et al. ..................... 528/310

* cited by examiner

*Primary Examiner* — James Seidleck
*Assistant Examiner* — Gregory Listvoyb
(74) *Attorney, Agent, or Firm* — Ladas & Parry LLP (57) ABSTRACT

The present invention relates to a negative photosensitive polyimide polymer having a repeating unit of formula (1) as a polymerized unit:

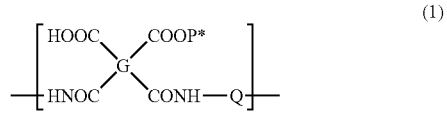

wherein G, Q and P* are as defined in the specification. The polyimide polymer of the present invention is developable in an aqueous alkaline solution, and has the properties associated with an insulating layer and photoresist.

7 Claims, 3 Drawing Sheets

NEGATIVE PHOTOSENSITIVE POLYIMIDE POLYMER AND USES THEREOF

BACKGROUND OF THE INVENTION

1. Field of the Invention

The present invention relates to a negative photosensitive polyimide polymer. The polymer has an acid radical, and is developable in an aqueous alkaline solution.

2. Description of the Prior Art

Polyimide (PI) is an organic polymer containing an imide group. As polyimide has excellent thermal stability and good mechanical, electronic, and chemical properties, it has always been the most popular high-performance polymer. In recent years, as requirements on properties have become more and more stringent in the semiconductor industry, and there are limits and defects in the application of the traditional inorganic materials, the use of polyimide can make up for the deficiencies of the traditional inorganic materials in some ways. In the semiconductor industry with stringent requirements on materials, polyimide is also used in passivation layers, stress buffer coatings, a particle masking films, dry etching protection masks, interlayer insulating films, and microelectromechanical applications and the like, while other new uses are under further development. Currently, among these applications, polyimide is primarily used in the coatings for protecting an integrated circuit (IC) element, mainly because the polyimide materials can pass the reliability test of the IC element. In fact, in addition to the application in IC industry, polyimide provides other important applications in electronic packaging, enameled wire, printed circuit board, sensing element, separating film and construction material, as a critical material.

Polyimides utilized in IC processes may be classified as the conventional non-photosensitive polyimides and the photosensitive polyimides (PSPI). The conventional polyimides have to be used in combination with a photoresist to provide the desired circuit pattern. In case of the photosensitive polyimides, a photosensitive group is present the main structure of the polyimides so as to impart the polyimides with photosensitivity, which allows the polyimides to have the properties associated with an insulating layer and photoresist, and can provide the desired circuit patterns upon direct exposure and development. In a semiconductor process, the application of photosensitive polyimides can save the amount of photoresist materials used, reduce the process steps and the cost, and improve the yield. Therefore, most of the semiconductor manufacturers have changed to use photosensitive polyimides.

In common lithography processes, if positive working photoresists are used, sidewall undercutting tends to occur upon development, resulting in the structural size error, which is even more severe when exposure dose is excessive. Accordingly, current commercially available photosensitive polyimides primarily are negative type systems, and can be classified into three kinds of polymers according to the molecular structures thereof:

1. Covalently Bonding Polyamic Esters (PAEs):

This system was developed by Siemens Corp., Germany, wherein the photosensitive crosslinking group, such as hydroxyethyl methacrylate (HEMA), was covalently bonded to the dianhydride via a nucleophilic reaction, then polymerized with the diamine monomer to produce the polyamic ester. In view of the difference in molecular structure, the covalently bonding photosensitive resin can create a negative type pattern by being exposed to a light source, where the exposed portion is crosslinked and will not dissolve in organic solvents, while the unexposed portion is soluble in organic solvents.

2. Ionically Bonding Polyamic Acids:

Based on a similar principle as that associated with the covalently bonding photosensitive polyimide, Toray Corp., Japan, mixed a polymerized polyamic acid with a tertiary amine having a photosensitive crosslinking group, so that the photosensitive crosslinking group was bonded to the backbone of the polyamic acid to produce a photosensitive material.

3. Self-photosensitive Polyimides:

This system was developed by Ciba-Geigy Corp., Switzerland, which is a soluble, completely imidized polyimide obtained by the reaction of benzophenonetetracarboxylic dianhydride (BTDA) with the diamine having an alkyl at the ortho-position. Such a material is self-photosensitive without a photoinitiator. Upon photoirradiation, the benzophenone group in the excited state captured the hydrogen atom from the alkyl at the ortho-position, causing crosslinking reaction and rendering the resin non-soluble.

Among the above-mentioned three systems, the covalently bonding photosensitive polyimides have better performance in lithographic imaging, and particularly are able to produce a photosensitive coating having a film thickness up to 100 μm, but is more costly. Although the photosensitive polyimides made by ionically bonding is less costly and easy to be synthesized, it is poor in performance as a result of insufficient strength in ionic bonding, and even the exposed crosslinked portion could be washed off by the developer. As for the self-photosensitive polyimides, they are seldom used due to the low photosensibility.

Moreover, the formula of the final product for a common photosensitive polyimide is somewhat complicated, that is, in addition to the polymer itself, a photoinitiator, a crosslinker, and a promoter should be added to improve the photosensitivity, resolution, and adhesion ability. In addition, most of the photosensitive polyimides need to be developed with an organic solvent, such as xylene, cyclohexanone, cyclopentanone or γ-butyrolactone. However, the organic solvent tends to cause swelling, which is detrimental to the resolution, and results in severe environmental pollution, and more wastewater treatment equipments, and therefore cost, are necessary.

In view of the shortcomings of the above-mentioned photosensitive polyimides in application, the present inventor provided, through extensive studies, a novel negative photosensitive polyimide that is developable in an aqueous alkaline solution and provides thermal stability, high resolution and high adhesion, thus being more satisfactory in industry.

SUMMARY OF THE INVENTION

The main object of the present invention is to provide a negative photosensitive polyimide polymer that is developable in an aqueous alkaline solution, wherein the polymer has a repeating unit of formula (1) as a polymerized unit:

wherein G is a tetravalent organic group; Q is selected from the group consisting of:

wherein each X is independently hydrogen, a halogen, a $C_1$-$C_4$ alkyl or a $C_1$-$C_4$ perfluoroalkyl, A is —O—, —S—, —CO—, —CH$_2$—, —OC(O)— or —CONH—, m is an integer from 1 to 3, and n is 0 or 1;

P* is a photosensitive group of formula (2):

wherein $R_1$ is hydrogen or methyl, and $R_2$ is phenylene, or a linear or branched $C_1$-$C_8$ alkylene, $C_1$-$C_8$ alkenylene, $C_1$-$C_8$ cycloalkylene, or $C_1$-$C_8$ hydroxyalkylene.

The negative photosensitive polyimide polymer according to the present invention has an acid radical itself, and thus it is developable in an aqueous alkaline solution, and more environment friendly than other currently commercially available negative photosensitive polyimide materials that are developed with an organic solution. Furthermore, the negative photosensitive polyimide polymer according to the present invention, having the properties associated with an insulating layer and photoresist, is useful in lithography processes for flexible printed boards, displays, micro-electronics, semiconductor devices, and opto-electronic devices.

BRIEF DESCRIPTION OF THE DRAWINGS

FIG. 3 FIG. 1 shows the 1H NMR spectrum of the compound of Formula (4.

DETAILED DESCRIPTION OF THE INVENTION

The negative photosensitive polyimide according to the present invention has the repeating unit of the formula (1) described above as a polymerized unit which is characterized by having a single photosensitive group P* of the formula (2) described above. Upon irradiation with a light source, the double bonds in the acrylate groups will interreact to provide a crosslinked structure, which allows the resultant polymer to have photosensitivity. The irradiated portion is cross-linked, which makes it difficult to be dissolved in the developing solvent, so that there is a difference in solubility between the irradiated portion and the non-irradiated portion. As a result, the non-irradiated portion is soluble in the developing solvent during development, and provides a negative type pattern. Also, since the chemical structure of the negative photosensitive polyimide according to the present invention only comprises one single photosensitive group, one photosensitive group less than the common negative photosensitive polyimides, its volume shrinkage ratio upon a cyclization reaction is reduced by half as compared with the common negative photosensitive polyimides.

According to the embodiments of the present invention, the photosensitive group P* is selected from the groups of formula (A) to formula (D):

In the polyimide polymer according to the present invention, group Q is preferably but not limited to:

and more preferably

In the polyimide polymer according to the present invention, G is not particularly limited and can be a tetravalent aliphatic group or a tetravalent aromatic group, preferably a tetravalent aromatic group. The tetravalent aromatic group can be a monocyclic or polycyclic group, preferably selected from the group consisting of:

wherein each Y is independently hydrogen, a halogen, a $C_1$-$C_4$ perfluoroalkyl or a $C_1$-$C_4$ alkyl, and B is —$CH_2$—,

—O—, —S—, —CO—, —SO$_2$—, —C(CH$_3$)$_2$— or —C(CF$_3$)$_2$—; more preferably selected from the group consisting of:

According to the present invention, the tetravalent aliphatic group is preferably selected from the group consisting of:

The negative photosensitive polyimide according to the present invention is prepared in a polymerization method, which is for example, but not limited to that shown in scheme 1.

Scheme 1 wherein G, Q and P* are as defined above.

As shown in scheme 1, a dianhydride monomer of formula (III) is dissolved in an organic polar solvent, such as N-methylpyrrolidone (NMP), dimethyl acetamide (DMAC), dimethyl formamide (DMF) or dimethyl sulfoxide (DMSO); a photosensitive group, for example a photosensitive group-containing alcohol of formula (II), is dropped in at a temperature ranging from about 20° C. to about 90° C. Other than the conventional methods for synthesizing polyimide, in the present invention, by controlling the equivalent amount of the dropped-in photosensitive group, preferably at an equivalent ratio of about 1, the photosensitive group is covalently esterified with an amic acid ester via a nucleophilic reaction for about 10 minutes to about 6 hours, to produce a dianhydride derivative having one acid group and one ester group.

Thereafter, water is added, and the reaction was allowed to stand for about 10 minutes to about 6 hours, and then an approximate equivalent of a diamine monomer of formula (IV) is added, and optionally an activator, such as N,N'-dicyclohexylcarbodiimide (DCC) or N,N'-diisopropylcarbodiimide (DIC), is added, to carry out polymerization to obtain the photosensitive polyimide. In conventional technologies, the synthesis of polyamide esters involves a chlorination preparation using thionyl chloride. However, since the chlorination preparation is sensitive to moisture, the prepared photosensitive resin is likely to have a reduced viscosity. Accordingly, in the present invention, the problems described above are overcome by using N,N'-dicyclohexylcarbodiimide or N,N'-diisopropyl carbodiimide, and satisfactory adhesion is achieved.

The negative photosensitive polyimide polymer according to the present invention may be used as a material for an insulating layer, or a photoresist for lithography processes. Since the chemical structure of the negative photosensitive polyimide according to the present invention only comprises one single photosensitive group, one photosensitive group less than the common negative photosensitive polyimides, it has a low cyclization temperature, and a low volume shrinkage ratio upon cyclization. Also, the negative photosensitive polyimide according to the invention has an acid radical and excellent adhesion, and is developable in an aqueous alkaline solution, thus being more environment friendly than other currently commercially available negative photosensitive polyimide materials that are developed with an organic solution.

Preferred embodiments of the photosensitive groups of formula (II) used in the methods described above, include, but not are not limited to, hydroxyethyl acrylate (HEA), 2-hydroxyethyl methacrylate (HEMA), glycidyl methacrylate (GMA) or glycidyl acrylate.

The dianhydride monomers used in the methods described above, as shown in formula (III), are used alone or in admixture of two or more of the monomers, and the specific examples thereof are preferably compounds of formula (E) to formula (I), formula (S), formula (T) or formula (U).

The specific examples of the diamine monomers used in the methods described above, as shown in formula (IV), are preferably compounds of formula (J) to formula (P), more preferably compounds of formula (J) to formula (M)

The lithography processes to which the negative photosensitive polyimide according to the present invention can be applied are well known to those skilled in the art, and for example, comprise the following steps:
(1) Mixing the negative photosensitive polyamide resin with a photoinitiator, and optionally conventional additives, to form a colloidal solution;
(2) Coating the colloidal solution onto the surface of a substrate to form a coating;
(3) Pre-baking the coating on the surface of the substrate to form a dried photoresist layer;
(4) Exposing the dried photoresist layer to an energetic ray;
(5) Post-baking the exposed photoresist layer; and
(6) Developing the photoresist layer with an aqueous alkaline solution as a developer, to form a patterned photoresist layer.

The photoinitiator used in step (1) described above is the one that generates free radicals upon photoirradiation and initiates the polymerization through transferring the free radicals. The photoinitiator useful in the present invention is, without any particular restriction, for example, but not limited to benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide, or mixtures thereof; and the preferred photoinitiator is benzophenone.

Additionally, trace additives, such as silane coupling agent, may be added in step (1), to enhance the adhesion of the photosensitive polyamide resin to the substrate. The common silane coupling agents are for example, but not limited to, 3-aminopropyl trimethoxy silane, 3-aminopropyl triethoxy silane, 2-aminopropyl trimethoxy silane, 2-aminopropyl triethoxy silane, and mixtures thereof.

The energetic ray used in the step (4) described above refers to, in a broad sense, a light source in a certain range of wavelengths, which is for example, but not limited to, ultraviolet light, infrared light, visible light or heat ray (irradiation or radiation), preferably ultraviolet light.

The aqueous alkaline solution developer used in the step (6) described above is, without any particular restriction, for example, but not limited to, aqueous 2.38 wt % tetramethyl ammonium hydroxide (TMAH) solution, aqueous 1-5 wt % sodium carbonate solution, or mixtures thereof.

The invention will be described in detail by the following examples, and the description is only used to illustrate the present invention, rather than to limit the scope of the present invention. Any modifications or variations that can be easily accomplished by persons skilled in the art are within the scope of the disclosure of the present specification and the attached claims.

EXAMPLE 1

21.8122 g (0.1 mole) of pyromellitic dianhydride (hereinafter abbreviated as PMDA) was dissolved in 200 g of N-methyl-2-pyrrolidinone (hereinafter abbreviated as NMP). The reaction was heated to 50° C., and stirred for 2 hours, and then 11.61 g (0.1 mole) of 2-hydroxyethyl acrylate (hereinafter abbreviated as HEA) was slowly dropped in, at a rate of 1 c.c. per 10 min. The temperature was kept at 50° C., and the reaction was stirred for 2 hours, and then 1.8 g (0.1 mole) of purified water was added. The reaction was stirred for 4 hours, then cooled to room temperature, to give the compound of formula (3):

Formula (3)

Figure 1:
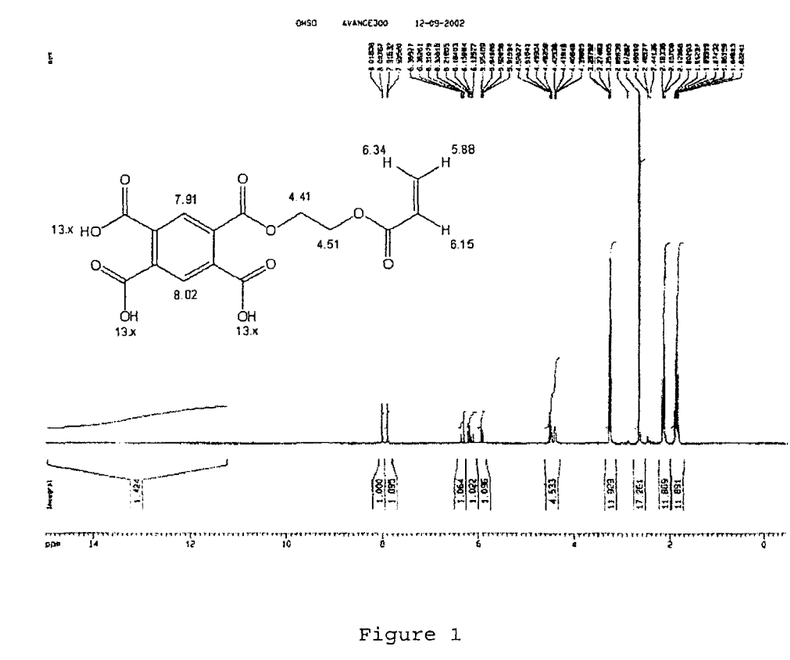
FIG. 1 shows the 1H NMR spectrum of the compound of Formula (3)
Figure 2:
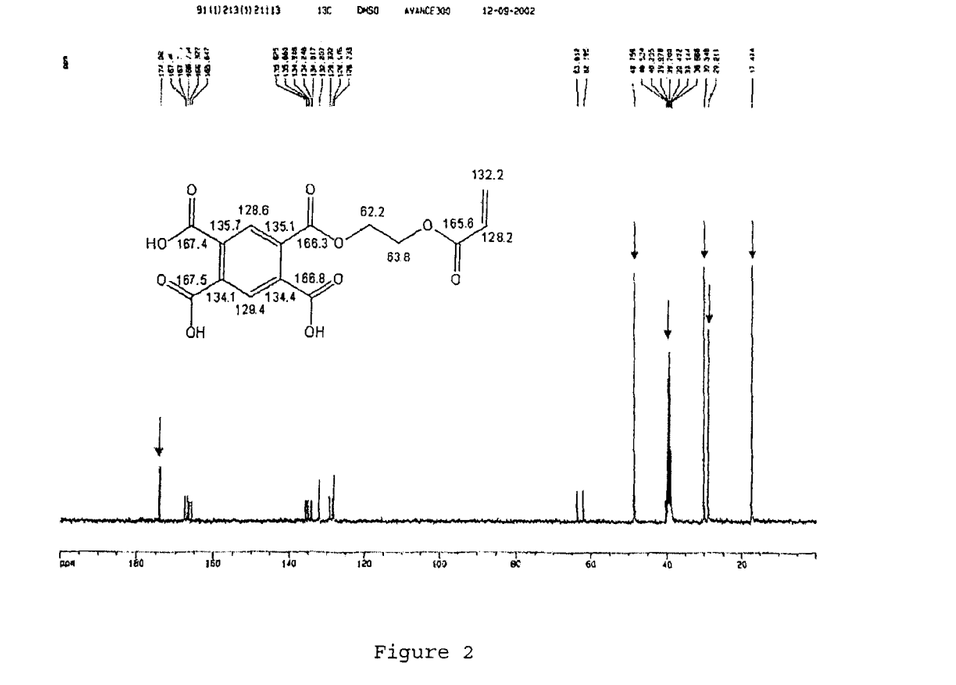
FIG. 2 shows the 13C NMR spectrum of the compound of Formula (3)

The 1H NMR spectrum of the compound of formula(3) is shown in FIG. 1 and the 13C NMR spectrum of formula (3) is shown in FIG. 2.

The compound of formula (3) was added into 20.02 g (0.1 mole) of 4,4'-diaminodiphenyl ether (hereinafter abbreviated as ODA), and the mixture was dissolved in 100 g of NMP. After the dissolution was completed, 0.328 g (0.002 mole) carbic anhydride (hereinafter referred to as CA) was added, and the reaction was stirred for one hour. The two solutions were mixed homogeneously in an ice bath, and then 41.26 g (0.2 mole) of N,N'-dicyclohexylcarbodiimide (hereinafter referred to as DCC) was added so that a coupling reaction was conducted. The temperature was kept at 0° C., and the reaction was stirred for 15 hours, and then filtered at low temperature, to give the compound of formula (4):

Formula (4)

Figure 3:
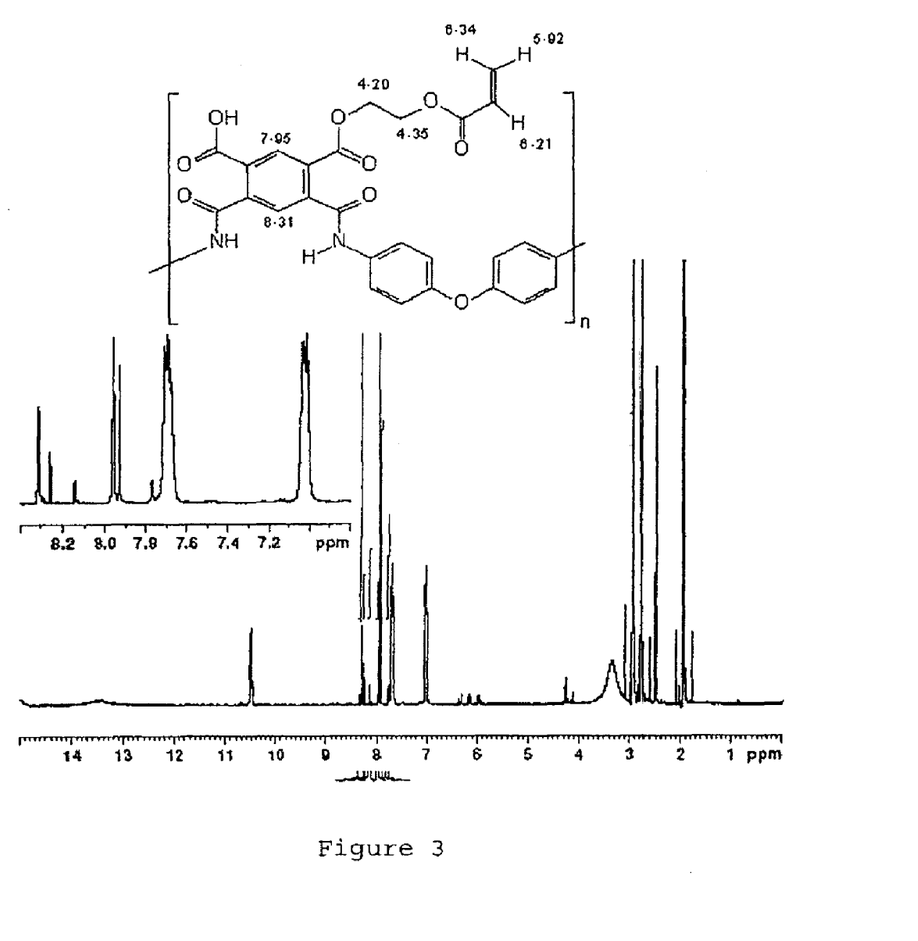

The $^1$H NMR spectrum of the compound of formula (4) is shown in FIG. 3 below.

EXAMPLE 2

21.8122 g (0.1 mole) of PMDA was dissolved in 200 g of NMP; the reaction was heated to 50° C., and stirred for 2 hours, and then 13.01 g (0.1 mole) of 2-hydroxyethyl methacrylate (hereinafter abbreviated as HEMA) was slowly dropped in, at a rate of 1 c.c. per 10 min. The temperature was kept at 50° C., and the reaction was stirred for 2 hours, and then 1.8 g (0.1 mole) of purified water was added. After the reaction was stirred for 4 hours, the reaction was cooled to room temperature. 20.02 g (0.1 mole) of ODA was dissolved in 100 g of NMP. After the dissolution was completed, 0.328 g (0.002 mole) of CA was added and the solution was stirred for 1 hour. Thereafter, the two solutions were mixed homogeneously in an ice bath, and then 41.26 g (0.2 mole) of DCC was added for conducting a coupling reaction. The temperature was kept at 0° C., the reaction was stirred for 15 hours, and then filtered at a low temperature to give the filtrate.

EXAMPLE 3

21.8122 g (0.1 mole) of PMDA was dissolved in 200 g of NMP; the reaction was heated to 50° C., and stirred for 2 hours, and then 3.6 g (0.2 mole) of purified water was added After the reaction was stirred for 4 hours, 14.22 g (0.1 mole) of glycidyl methacrylate (hereinafter abbreviated as GMA) was added. The temperature was kept at 80° C., and the reaction was stirred for 8 hours, and then cooled to room temperature. 20.02 g (0.1 mole) of ODA was dissolved in 100 g of NMP; after the dissolution was completed, 0.328 g (0.002 mole) of CA was added and the solution was stirred for 1 hour. The two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 4

21.8122 g (0.1 mole) of PMDA was dissolved in 200 g of NMP; the reaction was heated to 50° C., and stirred for 2 hours, and then 3.6 g (0.2 mole) of purified water was added; after the reaction was stirred for 4 hours, 12.82 g (0.1 mole) of glycidyl acrylate (hereinafter abbreviated as GA) was added; the temperature was kept at 80° C., and the reaction was stirred for 8 hours, and then cooled to room temperature. 20.02 g (0.1 mole) of ODA was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 5

21.8122 g (0.1 mole) of PMDA was dissolved in 200 g of NMP; the reaction was heated to 50° C., and stirred for 2 hours, and then 11.61 g (0.1 mole) of HEA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 10.81 g (0.1 mole) of para-phenylenediamine (hereinafter abbreviated as pPDA) was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 6

21.8122 g (0.1 mole) of PMDA was dissolved in 200 g of NMP; the reaction was heated to 50° C., and stirred for 2 hours, and then 13.01 g (0.1 mole) of HEMA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 10.81 g (0.1 mole) of pPDA was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 7

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 14.22 g (0.1 mole) of GMA was added; the temperature was kept at 80° C., the reaction was stirred for 8 hours, and then cooled to room temperature. 10.81 g (0.1 mole) of pPDA was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 8

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 12.82 g (0.1 mole) of GA was added; the temperature was kept at 80° C., and the reaction was stirred for 8 hours, and then cooled to room temperature. 10.81 g (0.1 mole) of pPDA was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 9

21.8122 g (0.1 mole) of PMDA was dissolved in 200 g of NMP; the reaction was heated to 50° C., and stirred for 2 hours, and then 11.61 g (0.1 mole) of HEA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 21.23 g (0.1 mole) of dimethyl dibenzilidine (hereinafter abbreviated as DMDB) was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 10

21.8122 g (0.1 mole) of PMDA was dissolved in 200 g of NMP; the reaction was heated to 50° C., and stirred for 2 hours, and then 13.01 g (0.1 mole) of HEMA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 21.23 g (0.1 mole) of DMDB was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 11

21.8122 g (0.1 mole) of PMDA was dissolved in 200 g of NMP; the reaction was heated to 5° C., and stirred for 2 hours, and then 3.6 g (0.2 mole) of purified water was added; after the solution was stirred for 4 hours, 14.22 g (0.1 mole) of GMA was added; the temperature was kept at 80° C., and the reaction was stirred for 8 hours, and then cooled to room temperature. 21.23 g (0.1 mole) of DMDB was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 12

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 12.82 g (0.1 mole) of GA was added; the temperature was kept at 80° C., and the reaction was stirred for 8 hours, and then cooled to room temperature. 21.23 g (0.1 mole) of DMDB was dissolved in 100 g of NMP; after the dissolution was completed, 0.328 g (0.002 mole) of CA was added; after the solution was stirred for 1 hour, the two solutions were mixed homogeneously in an ice bath, and 41.26 g (0.2 mole) of DCC was added for conducting a coupling reaction. The temperature was kept at 0° C., and the reaction was stirred for 15 hours, and then filtered at a low temperature to give the filtrate.

EXAMPLE 13

21.8122 g (0.1 mole) of PMDA was dissolved in 200 g of NMP; the reaction was heated to 50° C., and stirred for 2 hours, and then 11.61 g (0.1 mole) of HEA was slowly dropped in, at a rate of 1 c.c. per 10 min; the temperature was kept at 50° C., and the reaction was stirred for 2 hours, and, and then 1.8 g (0.1 mole) of purified water was added; after the solution was stirred for 4 hours, it was cooled to room temperature. 21.23 g (0.1 mole) of o-Tolidine (hereinafter abbreviated as OTLD) was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at low temperature to give the filtrate.

EXAMPLE 14

21.8122 g (0.1 mole) of PMDA was dissolved in 200 g of NMP; the reaction was heated to 50° C., and stirred for 2 hours, and then 13.01 g (0.1 mole) of HEMA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 21.23 g (0.1 mole) of OTLD was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 15

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 14.22 g (0.1 mole) of GMA was added; the temperature was kept at 80° C., and the reaction was stirred for 8 hours, and then cooled to room temperature. 21.23 g (0.1 mole) of OTLD was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 16

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 12.82 g (0.1 mole) of GA was added; the temperature was kept at 80° C., the reaction was stirred for 8 hours, and then cooled to room temperature. 21.23 g (0.1 mole) of OTLD was dissolved in 100 g of NMP; after the dissolution was completed, 0.328 g (0.002 mole) of CA was added; after the solution was stirred for 1 hour, the two solutions were mixed homogeneously in an ice bath, and then with 41.26 g (0.2 mole) of DCC was added for conducting a coupling reaction. The temperature was kept at 0° C., and the reaction was stirred for 15 hours, and then filtered at a low temperature to give the filtrate.

EXAMPLE 17

21.8122 g (0.1 mole) of PMDA was dissolved in 200 g of NMP; the reaction was heated to 50° C., and stirred for 2 hours; and then 11.61 g (0.1 mole) of HEA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 18.43 g (0.1 mole) of benzidine (hereinafter abbreviated as BZD) was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 18

21.8122 g (0.1 mole) of PMDA was dissolved in 200 g of NMP; the reaction was heated to 50° C., and stirred for 2 hours, and then 13.01 g (0.1 mole) of HEMA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 18.43 g (0.1 mole) of BZD was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 19

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 14.22 g (0.1 mole) of GMA was added; the temperature was kept at 80° C., and the reaction was stirred for 8 hours, and then cooled to room temperature. 18.43 g (0.1 mole) of BZD was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EMBODIMENT 20

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 12.82 g (0.1 mole) of GA was added; the temperature was kept at 80° C., and the reaction was stirred for 8 hours, and then cooled to room temperature. 18.43 g (0.1 mole) of BZD was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 21

21.8122 g (0.1 mole) of PMDA was dissolved in 200 g of NMP; the reaction was heated to 50° C., and stirred for 2 hours, and then 11.61 g (0.1 mole) of HEA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 32.02 g (0.1 mole) of trifluoromethyl dibenzilidine (hereinafter briefly referred to as TFMB) was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 22

21.8122 g (0.1 mole) of PMDA was dissolved in 200 g of NMP; the reaction was heated to 50° C., and stirred for 2 hours, and then 13.01 g (0.1 mole) of HEMA was slowly dropped in, at a rate of 1 c.c. per 10 min; the temperature was kept at 50° C., and the reaction was stirred for 2 hours, and then 1.8 g (0.1 mole) of purified water was added; after the solution was stirred for 4 hours, it was cooled to room temperature. 32.02 g (0.1 mole) of TFMB was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

EXAMPLE 23

21.8122 g (0.1 mole) of PMDA was dissolved in 200 g of NMP; the reaction was heated to 50° C., and stirred for 2 hours, and then 3.6 g (0.2 mole) of purified water was added; after it was stirred for 4 hours, 14.22 g (0.1 mole) of GMA was added; the temperature was kept at 80° C., and the reaction was stirred for 8 hours, and then cooled to room temperature. 32.02 g (0.1 mole) of TFMB was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at low temperature, to give the filtrate.

EXAMPLE 24

21.8122 g (0.1 mole) of PMDA was dissolved in 200 g of NMP; the reaction was heated to 50° C., and stirred for 2 hours, and then 3.6 g (0.2 mole) of purified water was added; after the solution was stirred for 4 hours, 12.82 g (0.1 mole) of GA was added; the temperature was kept at 80° C., and the reaction was stirred for 8 hours, and then cooled to room temperature. 32.02 g (0.1 mole) of TFMB was dissolved in 100 g of NMP; after the dissolution was completed, 0.328 g (0.002 mole) of CA was added; after the solution was stirred for 1 hour, the two solutions were mixed homogeneously in an ice bath, and then 41.26 g (0.2 mole) of DCC was added for conducting a coupling reaction. The temperature was kept at 0° C., and the reaction was stirred for 15 hours, and then filtered at a low temperature to give the filtrate.

As described above, since the photosensitive polyimide according to the present invention has an acid radical on the backbone chain, it is readily soluble in an aqueous alkaline solution, and therefore can achieve a preferred developing effect in an aqueous alkaline solution developer, and can be developed with an aqueous alkaline solution. Consequently, the photosensitive polyimide according to the present invention not only fulfills the requirements regarding the environmental protection, but also is beneficial to the production of high-resolution circuits.

Features shown in broken lines show environmental structure and form no part of the claimed design.

What is claimed is:

1. A negative photosensitive polyimide polymer having a repeating unit of formula (1) as a polymerized unit:

(1)

wherein G is a tetravalent organic group:
Q is selected from the group consisting of:

and wherein each X independently is hydrogen, a halogen, a $C_1$-$C_4$ alkyl or a $C_1$-$C_4$ perfluoroalkyl, A is —O—, —S—, —CO—, —CH$_2$—, —OC(O)— or —CONH—, m is an integer from 1 to 3, and n is 0 or 1;
P* is a photosensitive group of formula (2):

formula (2)

wherein $R_1$ is hydrogen or methyl, and $R_2$ is phenylene, or a linear or branched $C_1$-$C_8$ alkylene, $C_1$-$C_8$ alkenylene, $C_1$-$C_8$ cycloalkylene, or $C_1$-$C_8$ hydroxyalkylene.

2. The negative photosensitive polyimide polymer as claimed in claim 1, wherein the tetravalent organic group is selected from the group consisting of:

and wherein each Y independently is hydrogen, a halogen, a $C_1$-$C_4$ perfluoroalkyl or $C_1$-$C_4$ alkyl, and B is —CH$_2$—, —O—, —S—, —CO—, —SO$_2$—, —C(CH$_3$)$_2$—, or —C(CF$_3$)$_2$—.

3. The negative photosensitive polyimide polymer as claimed in claim 2, wherein the tetravalent organic group is selected from the group consisting of:

4. The negative photosensitive polyimide polymer as claimed in claim 1, wherein Q is selected from the group consisting of:

-continued and

5. The negative photosensitive polyimide polymer as claimed in claim 4, wherein Q is or

6. The negative photosensitive polyimide polymer as claimed in claim 1, wherein P* is $$H_2C{=}\overset{CH_3}{\underset{}{C}}{-}\overset{O}{\underset{}{C}}{-}O{-}C_2H_4{-}, \quad H_2C{=}\overset{}{\underset{H}{C}}{-}\overset{O}{\underset{}{C}}{-}O{-}C_2H_4{-},$$

$$H_2C{=}\overset{CH_3}{\underset{}{C}}{-}\overset{O}{\underset{}{C}}{-}O{-}CH_2{-}\underset{OH}{CH}{-}CH_2{-} \quad \text{or}$$

$$H_2C{=}\overset{}{\underset{H}{C}}{-}\overset{O}{\underset{}{C}}{-}O{-}CH_2{-}\underset{OH}{CH}{-}CH_2{-}.$$

7. The negative photosensitive polyimide polymer as claimed in claim 1, which is used in a lithography process as a photoresist.

* * * * *